United States Patent
Miyajima et al.

(10) Patent No.: US 7,523,769 B2
(45) Date of Patent: Apr. 28, 2009

(54) ENCLOSED CONTAINER LID OPENING/CLOSING SYSTEM AND ENCLOSED CONTAINER LID OPENING/CLOSING METHOD

(75) Inventors: Toshihiko Miyajima, Tokyo (JP); Hitoshi Suzuki, Tokyo (JP); Hiroshi Igarashi, Tokyo (JP)

(73) Assignee: TDK Corporation, Tokyo (JP)

( * ) Notice: Subject to any disclaimer, the term of this patent is extended or adjusted under 35 U.S.C. 154(b) by 489 days.

(21) Appl. No.: 11/257,307

(22) Filed: Oct. 25, 2005

(65) Prior Publication Data

US 2006/0088406 A1   Apr. 27, 2006

(30) Foreign Application Priority Data

Oct. 26, 2004   (JP) .............................. 2004-310327

(51) Int. Cl.
- *B65B 31/04* (2006.01)
- *B65D 85/86* (2006.01)
- *B65G 1/133* (2006.01)
- *H01L 21/673* (2006.01)

(52) U.S. Cl. .............................. 141/47; 141/4; 141/11; 141/63; 141/85; 141/91; 141/98; 206/711; 414/217.1

(58) Field of Classification Search .................. 141/11, 141/63, 66, 47, 48, 70, 85, 89, 91, 4, 65, 141/98; 206/710–712; 414/217.1, 411
See application file for complete search history.

(56) References Cited

U.S. PATENT DOCUMENTS

| | | | |
|---|---|---|---|
| 4,724,874 A | 2/1988 | Parikh et al. | |
| 5,320,218 A * | 6/1994 | Yamashita et al. | 141/67 |
| 5,433,574 A | 7/1995 | Kawano et al. | |
| 5,575,081 A | 11/1996 | Ludwig | |
| 5,586,585 A | 12/1996 | Bonora et al. | |
| 5,621,982 A | 4/1997 | Yamashita et al. | |
| 5,664,679 A | 9/1997 | Schneider et al. | |
| 5,743,424 A | 4/1998 | Murata et al. | |
| 5,772,386 A | 6/1998 | Mages et al. | |
| 5,806,574 A * | 9/1998 | Yamashita et al. | 141/63 |
| 5,810,062 A | 9/1998 | Bonora et al. | |
| 5,988,233 A | 11/1999 | Fosnight et al. | |
| 6,043,651 A * | 3/2000 | Heid | 324/307 |
| 6,044,874 A * | 4/2000 | Saga | 141/63 |
| 6,056,026 A | 5/2000 | Fosnight et al. | |
| 6,123,120 A * | 9/2000 | Yotsumoto et al. | 141/65 |
| 6,135,168 A | 10/2000 | Yang et al. | |
| 6,164,664 A | 12/2000 | Fosnight et al. | |
| 6,267,158 B1 * | 7/2001 | Saga | 141/94 |

(Continued)

FOREIGN PATENT DOCUMENTS

EP   1 075 023 A1   2/2001

(Continued)

*Primary Examiner*—Timothy L Maust
*Assistant Examiner*—Nicolas A Arnett
(74) *Attorney, Agent, or Firm*—Oblon, Spivak, McClelland, Maier & Neustadt, P.C.

(57) ABSTRACT

In order to easily and surely remove contaminants or the like from wafers stored in a pod (FOUP), a gas supply pipe is located above an opening portion in a FIMS system. A clean gas is blown to the upper surfaces of the wafers stored in the inner portion of the pod through the gas supply pipe to remove the contaminants or the like from wafers.

6 Claims, 7 Drawing Sheets

U.S. PATENT DOCUMENTS

| | | | |
|---|---|---|---|
| 6,319,297 B1 | 11/2001 | Fosnight | |
| 6,533,000 B2 * | 3/2003 | Saga | 141/98 |
| 6,588,123 B2 * | 7/2003 | Chen et al. | 414/217.1 |
| 6,772,805 B2 * | 8/2004 | Tsai et al. | 141/98 |
| 6,796,763 B2 * | 9/2004 | Miyajima et al. | 414/217.1 |
| 6,817,822 B2 | 11/2004 | Tokunaga | |
| 6,867,153 B2 | 3/2005 | Tokunaga | |
| 6,883,770 B1 * | 4/2005 | Miyajima et al. | 248/544 |
| 6,899,145 B2 * | 5/2005 | Aggarwal | 141/11 |
| 6,901,971 B2 * | 6/2005 | Speasl et al. | 141/4 |
| 6,984,839 B2 * | 1/2006 | Igarashi et al. | 414/411 |
| 6,997,217 B2 * | 2/2006 | Shih et al. | 141/98 |
| 7,077,173 B2 * | 7/2006 | Tokunaga | 141/66 |
| 7,360,346 B2 * | 4/2008 | Miyajima et al. | 141/91 |
| 2004/0099826 A1 * | 5/2004 | Igarashi et al. | 250/559.29 |
| 2004/0152322 A1 * | 8/2004 | Tokunaga | 438/689 |
| 2004/0237244 A1 * | 12/2004 | Suzuki et al. | 15/301 |
| 2005/0095098 A1 * | 5/2005 | Miyajima et al. | 414/411 |
| 2007/0151619 A1 | 7/2007 | Okabe | |
| 2007/0151620 A1 | 7/2007 | Okabe | |

FOREIGN PATENT DOCUMENTS

| | | |
|---|---|---|
| JP | 6-69313 | 3/1994 |
| JP | 7-45488 | 2/1995 |
| JP | 11-251422 | 9/1999 |
| JP | 11-307623 | 11/1999 |
| JP | 11-316084 | 11/1999 |
| JP | 3180600 | 4/2001 |
| JP | 3252457 | 11/2001 |
| JP | 3277550 | 2/2002 |
| JP | 3331693 | 7/2002 |
| JP | 3355697 | 10/2002 |
| JP | 2002-353293 | 12/2002 |
| JP | 2003-45933 | 2/2003 |
| JP | 2004-235516 | 8/2004 |
| KR | 2003-0011536 | 2/2003 |
| KR | 10-2004-0069991 | 8/2004 |

* cited by examiner

ENCLOSED CONTAINER LID OPENING/CLOSING SYSTEM AND ENCLOSED CONTAINER LID OPENING/CLOSING METHOD

BACKGROUND OF THE INVENTION

1. Field of the Invention

The present invention relates to a so-called front-opening interface mechanical standard (FIMS) system used when wafers held in a transfer container which is called a pod are transferred among semiconductor processing apparatuses in a semiconductor manufacture process or the like. More specifically, the present invention relates to a purging apparatus and a purging method for cleaning the inner portion of a pod in the FIMS system in which the pod containing the wafers which is called a front-opening unified pod (FOUP) is placed and the wafers are moved from and into the pod.

2. Related Background Art

Up to now, a semiconductor manufacture process has been conducted in a so-called clean room in which a room in which semiconductor wafers are treated has high cleanliness. However, in order to deal with the increase of a wafer size and the reduction of a cost required to maintain the room clean, a method of maintaining the inner portion of a processing apparatus, the pod (wafer container), and a mini-environment for substrate transferred from the pod to the processing apparatus with a high cleanliness state is employed in recent years.

The pod includes a main body portion having a substantially cube shape and a lid. The main body portion includes a rack capable of holding a plurality of wafers therein in a state in which the wafers are separated from one another in parallel and an opening portion which is provided on a surface of the main body and is used for wafer transfer. The opening portion is closed with the lid. A pod in which a forming surface of the opening portion is located not vertically below the pod but on a side surface of the pod (in front of the mini-environment) is generically called a front-opening unified pod (FOUP). The present invention is mainly for arrangemants using the FOUP.

The above-mentioned mini-environment includes a first opening portion opposed to the opening portion of the pod, a door for closing the first opening portion, a second opening portion provided on a semiconductor processing apparatus side, and a transfer robot that moves from the first opening portion to the inner portion of the pod to hold the wafer and passes through the second opening portion to transfer the wafer to the semiconductor processing apparatus side. A structure for forming the mini-environment includes a mount base for supporting the pod so that the opening portion of the pod is simultaneously opposed to the front surface of the door. A positioning pin inserted into a positioning hole provided on a lower surface of the pod to regulate a mount position of the pod and a clamp unit engaged with a portion to be clamped which is provided on the lower surface of the pod to hold the pod to the mount base are located on an upper surface of the mount base. The mount base is normally movable back and forth with respect to a direction toward a door by a predetermined distance. When the wafers in the pod are to be transferred to the processing apparatus, the pot is moved in a state in which the pod is mounted until the lid of the pod comes in contact with the door. After that contact, the lid is removed from a position at which the lid closes the opening to open the pod. Therefore, the inner portion of the pod is connected to the inner portion of the processing apparatus through the mini-environment. Subsequently, wafer transfer operation is repeated. A system including the mount base, the door, the first opening portion, a door opening/closing mechanism, and a wall which is a part of the mini-environment including the first opening portion is generally called a front-opening interface mechanical standard (FIMS) system.

An inner portion of the pod storing the wafers and the like is normally filled with dry nitrogen or the like which is maintained to a highly clean state, thereby preventing contaminants, an oxidizing gas, or the like from entering the inner portion of the pod. However, the pod stores wafers passing through a processing chamber, so there may be the case where contaminants or the like are deposited on the wafers in the processing chamber or the like and the wafers on which the contaminants are deposited are taken in the pod. When the wafers on which the contaminants or the like are deposited are taken in a subsequent processing chamber, desirable wafer processing which is normally performed by passing through the subsequent processing chamber is impossible in some cases. Therefore, when the wafers are transferred from the pod to a transfer chamber, it is necessary to remove the contaminants or the like.

In the conventional FOUP, in order to meet such a requirement, a gas supply port for introducing a purge gas into the pod and an gas evacuation port for evacuating the purge gas from the pod are provided in a bottom portion of the pod. The gas supply port and the gas evacuation port are connected to a purge gas supply port and a purge gas evacuation port, respectively, which are provided in a support base on which the pod is placed. According to actual operation, a high-pressure gas which is maintained to a highly clean state is introduced from the support base side into the pod through the gas supply ports. Simultaneously, gases and contaminants which are present in the inner portion of the pod are evacuated to the outside of the pod through the gas evacuation ports. The contaminants or the like deposited on the wafer taken in the pod are removed by the above-mentioned operation.

However, when the high-pressure gas is merely introduced from the bottom portion of the pod, the gas may flow through mainly the vicinities of the circumferences of wafers through which the gas easily passes. Therefore, it may be difficult to pass a gas having a sufficient flow rate through spaces above and below each of the wafers held at minute intervals. The contaminants or the like are deposited mainly on an upper surface of each of the wafers or a lower surface thereof, so it may be difficult to sufficiently remove the contaminants or the like by a conventional method. Such a situation may become more significant with an increase in wafer size. Therefore, more suitable removal methods are desired.

A method disclosed in JP 2003-045933 A is proposed as a method of surely removing the contaminants deposited on the wafer. According to this method, a space for storing an opener, which is separated from the transfer chamber, is provided. The space includes a gas supply port located above the front surface of an opening portion of the pod. A clean gas is supplied to the inner portion of the pod through the gas supply port and circulated through the inner portion of the pod. The clean gas flowing from a lower portion of the pod to the space is evacuated from a lower portion of the space. When the clean gas is circulated through the inner portion of the pod using such a structure, the contaminants or the like can be more surely removed as compared with the conventional method.

A method of introducing a clean gas between adjacent wafers held in the inner portion of the pod is disclosed in JP 11-251422 A. According to this method, a gas introducing flow path and a gas evacuating flow path which are communicated with each of groove portions for storing each of the wafers are provided in the inner portion of the pod. A clean gas is blown to the surface of each of the wafers through the gas introducing flow path and a clean gas containing the contaminants or the like is evacuated through the gas evacuating flow path, so that the contaminants can be more surely removed.

According to the method disclosed in JP 2003-045933 A, some degree of effect can be expected with respect to reductions in humidity of the inner portion of the pod and in the amount of oxidizing gas thereof, and prevention of organic contamination. However, it may be also difficult to perform effective replacement on gases or the like which are present between adjacent wafers held with a minute space. Therefore, it may be similarly difficult to obtain an effect in which the contaminants deposited on the upper and lower surfaces of each of the wafers are removed.

According to the method disclosed in JP 11-251422 A, the contaminants deposited on the upper and lower surfaces of the wafer can be removed. However, it may be difficult to provide a gas introducing flow path having a large inner diameter in view of an actual structure. Therefore, it is expected that a pressure difference of a gas introduced to the surface of the wafer or a difference of time for which the gas is introduced at a predetermined pressure is caused between the upstream of this flow path and the downstream thereof, and thus a contaminant removal effect varies according to a position in which the wafer is held.

The support base, a shape of the pod, arrangements of the clean gas supply port and the gas evacuation port which are provided for purging of the inner portion of the pod, and the like are substantially standardized in the semiconductor manufacture industry. Therefore, there is a problem in that the system disclosed in JP 2003-045933 A or the pod disclosed in JP 11-251422 A, which requires a structure different from that of this standard cannot be commonly applied to the support base and the like which are currently normally used.

SUMMARY OF THE INVENTION

The present invention has been made in view of the above-mentioned circumstances. An object of the present invention is to provide a storage container lid opening/closing system such as a FIMS having an apparatus capable of effectively removing contaminants or the like which are deposited on a wafer for purging an inner portion of a front-opening type object-to-be-stored storing container such as a FOUP. Another object of the present invention is to provide a method of purging such a storage container.

In order to solve the above-mentioned problem, an enclosed container lid opening/closing system according to the present invention is a lid opening/closing system for removing, from a storage container including a main body and a lid, the main body including an opening provided in a horizontal direction and a plurality of shelves arranged in a vertical direction, on each of which an object to be stored is placed, the lid being removable from the main body and covering the opening to form an enclosed space with the main body, to open the opening for insertion and removal of the object to be stored. The system is characterized by including: a mount base on which the storage container is placed; an opening portion located adjacent to the mount base and opposite to the opening in the horizontal direction; a door capable of holding the lid and capable of closing the opening portion, the door connecting between the opening and the opening portion by holding the lid and opening the opening portion; and a gas supply unit located above the opening portion on a side different from a side on which the mount base is placed in the opening portion, for supplying a predetermined gas to the object to be stored which is stored in the storage container in a state in which the opening and the opening portion are connected to each other.

In the lid opening/closing system, it is preferable that the gas supply unit include a pipe extended substantially parallel to a purged surface of the object to be stored and the pipe include a slit for supplying the predetermined gas toward a region in which the object to be stored is located in the state in which the opening and the opening portion are connected to each other. Alternatively, it is preferable that the gas supply unit be supported above the opening portion to be pivotable about a shaft substantially parallel to the purged surface of the object to be stored. According to the structure, it is possible to surely and efficiently remove contaminants or the like which are present on the purged surface of the object to be stored.

Further, in order to solve the above-mentioned problem, a purging method for an object-to-be-stored which is stored in an enclosed container according to the present invention is an object-to-be-stored purging method of removing, from a storage container including a main body and a lid, the main body including an opening provided in a horizontal direction and a plurality of shelves arranged in a vertical direction, on each of which an object to be stored is placed, the lid being removable from the main body and covering the opening to form an enclosed space with the main body, to open the opening, and of performing purge operation by blowing a predetermined gas to the object to be stored which is stored in the storage container. The method is characterized by including: placing the storage container on a mount base in a lid opening/closing system including an opening portion opposed to the opening and the mount base located in a front surface of the opening portion; removing the lid from the main body by a door of the lid opening/closing system for closing the opening portion while the lid is held by the door; and performing purging on the object to be stored by blowing the predetermined gas from a gas supply unit located above the opening portion to the object to be stored which is stored in the storage container through the opening and the opening portion.

In the above-mentioned purging method, it is preferable that the gas supply unit include a pipe extended substantially parallel to a purged surface of the object to be stored and the pipe include a slit for supplying the predetermined gas toward a region in which the object to be stored is located in the state in which the opening and the opening portion are connected to each other. Alternatively, it is preferable that the gas supply unit be supported above the opening portion to be pivotable about a shaft substantially parallel to a purged surface of the object to be stored and the predetermined gas is supplied and pivoting by a predetermined angle is performed in the state in which the opening and the opening portion are connected to each other. According to the structure, it is possible to surely and efficiently remove contaminants or the like which are present on the purged surface of the object to be stored.

In the above-mentioned purging method, the object to be stored corresponds to a wafer used for semiconductor manufacturing or a part processed in a high-clean environment. The pod corresponding to the storage container includes a FOUP as an example of a pod for storing a semiconductor wafer. The pod is not particularly limited to the FOUP when it stores various parts. More specifically, the front-opening container can be used as the above-mentioned storage container. A state in which the lid is removed from the main body corresponds to a state in which a pod is placed on a load port and the wafer stored in the pod is transferred to a wafer processing apparatus through the load port. A specific example of the lid opening/closing system having a purge apparatus is the above-mentioned FIMS system.

The purge operation described here means an operation for removing contaminants such as dusts, an organic matter, an impurity element, an oxidizing gas, which are deposited on a part. Mapping means an operation for detecting the presence or absence of a wafer stored in each shelf of a rack and associating the detection information with shelf position information. A gas supplied to the gas supply unit is preferably a predetermined gas, that is, a high-purity clean gas represented by dry nitrogen. The gas supply unit is a generic name of a structure for supplying the clean gas to the object to be stored, such as a gas supply pipe or a nozzle.

According to the present invention, the contaminants or the like can be effectively and surely removed by supplying a purge gas such as dry nitrogen having high cleanliness to the surface of each of the wafers. Therefore, it is possible to hold the wafers in the inner portion of the pod with a high-cleanliness state as compared with a conventional case. When the slit formed in the gas supply pipe or a blow angle of a gas supply nozzle formed therein is adjusted, the purge operation on the surface of each of the wafers can be performed using a suitably spread clean gas which is pressurized. Therefore, according to the present invention, it is possible to control the amount of gas, a purge time, and the like, which are required to remove the contaminants or the like according to each of the wafers. Thus, the removal operation can be performed under a constant condition, so that a control state of all the wafers in the pod can be easily and constantly maintained. The gas supply pipe and the like in the present invention are easily attached to an existing FIMS system, so that a cost required for embodying the present invention can be suppressed.

The above and other objects, features and advantages of the invention will become more apparent from the following detailed description taken in conjunction with the accompany drawings.

DETAILED DESCRIPTION OF THE PREFERRED EMBODIMENTS

Figure 1:
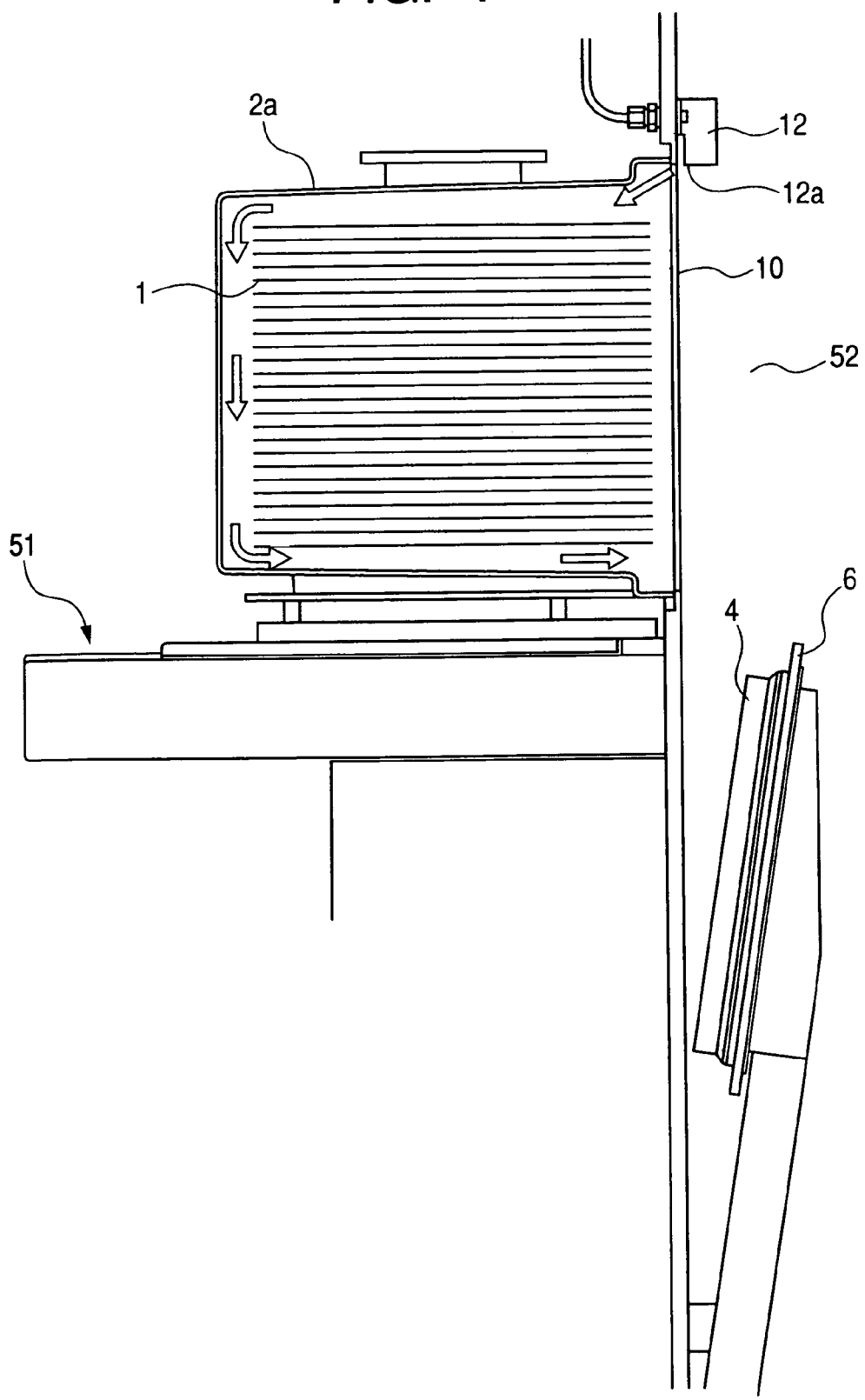
FIG. 1 is a schematic structural view showing a purge apparatus, a pod, a pod lid, and a part of an opener according to an embodiment of the present invention when they are cut with a cut plane perpendicular to an opening of the pod.

Hereinafter, embodiments of the present invention will be described with reference to the drawings. FIG. 1 is a schematic structural view showing a main part of a FIMS system including a purge apparatus according to an embodiment of the present invention, which shows a state when a cross section of the main part of the FIMS system holding a pod which is opened with a pod lid is viewed from side. Note that the pod inherently includes various members such as a rack for supporting wafers and a seal member located between the pod lid and the pod. Further, various members are attached to a door. However, these members are not directly associated with the present invention, so the detailed illustration and description will be omitted.

In FIG. 1, a main body 2a of a pod 2 includes a space for storing wafers 1, each of which is an object to be processed, in an inner portion thereof. The main body 2a has a box shape and includes an opening portion provided in one of surfaces located in a horizontal direction. The pod 2 includes a lid 4 for enclosing the opening portion of the main body 2a. The main body 2a includes a rack having a plurality of shelves for stacking the wafers 1 which are horizontally held in a vertical direction. Each of the wafers 1 placed on the shelves are stored in the inner portion of the pod 2 at predetermined intervals. The opening portion side of the pod 2 is opposed and connected to an opening portion 10 of a transfer chamber 52 which is provided on the side of a load port portion 51. The lid 4 is held by a port door 6 normally closing the opening portion 10, and is moved by a drive mechanism (not shown) so that a connection is established between the opening portion of the pod 2 and the transfer chamber 52.

Figure 2A:
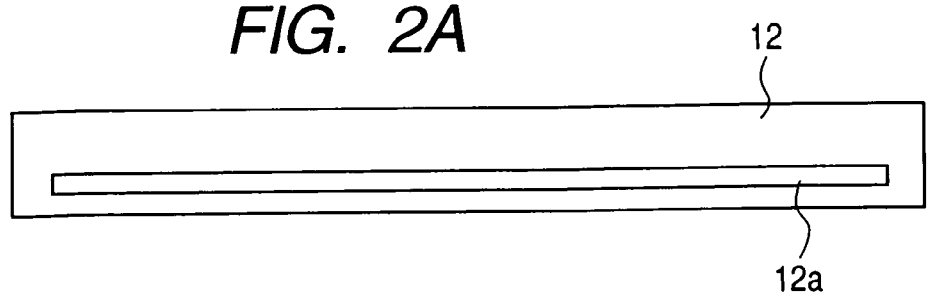
FIG. 2A is a structural view showing a gas supply pipe 12 shown in FIG. 1 when it is viewed from below.
Figure 2B:
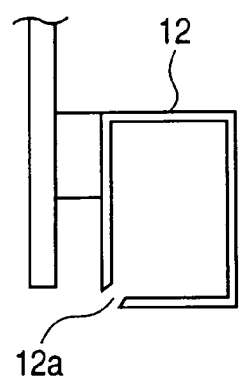
FIG. 2B is a structural view showing the gas supply pipe 12 shown in FIG. 1 in a state in which it is cut with the same plane as that of FIG. 1.

A gas supply pipe 12 is mounted on an inner wall of the transfer chamber 52 above the opening portion 10. FIG. 2A shows the mounted gas supply pipe 12 when it is viewed from below. FIG. 2B is a cross sectional view showing the mounted gas supply pipe 12 which is cut along substantially the same plane as that shown in FIG. 1. The gas supply pipe 12 is a hollow pipe which is connected to a source for supplying a clean gas such as pressurized dry nitrogen (not shown) and is extended in one direction (direction perpendicular to the surface of a paper in FIG. 1). The gas supply pipe 12 includes a slit 12a capable of supplying the clean gas to the inner portion of the pod. The slit 12a is formed along the direction in which the gas supply pipe 12 is extended such that an opening of the gas supply pipe 12 faces pod opening side end portions of the wafers 1 stored in the inner portion of the pod 2.

The clean gas supplied to the wafers 1 through the slit 12a of the gas supply pipe 12 is used to remove contaminants or the like deposited on the surfaces of the wafers 1. A gas containing the contaminants or the like passes through a path indicated by arrows in FIG. 1 to evacuate the contaminants or the like to the outside of the FOUP. The contaminants or the like fall to a lower portion of the transfer chamber 52 and are sucked and evacuated from a suction evacuation port (not shown) provided in the lower portion of the transfer chamber 52. A normal gas supply system or the like are used for the gas supply system for supplying the pressurized clean gas to the gas supply pipe 12, a valve for starting and stopping gas supply, and the like. Therefore, the descriptions are omitted in this embodiment. It is preferable to supply the clean gas to the entire surface of each wafer through the gas supply pipe. Thus, it is preferable that the direction in which the gas supply pipe 12 and the slit 12a extend be substantially parallel to the purged surface of an object to be stored, that is, the wafer surface.

The gas or the like which is supplied to the inner portion of the pod 2 through the gas supply pipe 12 may be evacuated through an evacuation port conventionally provided in the pod 2. The purge operation is performed in a state in which the lid 4 is open, so the gas evacuation may be performed using an evacuation system (not shown) provided in the transfer chamber. It is preferable that the contaminants or the like which are temporarily removed from a wafer be prevented from re-depositing on another wafer or the inner portion of the pod or flowing into the transfer chamber. In this case, in order to efficiently evacuate the clean gas used for removal operation of the contaminants or the like, an evacuation-purpose booth connected to the opening portion of the pod may be provided in the transfer chamber.

As described above, it is preferable that the contaminants or the like which are temporarily removed from the surface of the wafer be rapidly moved to the outside of the pod. Therefore, in order to remove the contaminants more efficiently, it is expected to provide an additional evacuation port corresponding to each of the wafers. However, such structural additions require a significant standard change to the pod set based on the standard. Therefore, when the present invention is to be applied to a system including the FOUP which is currently used, it is preferable that such an evacuation port is not provided.

The contaminants or the like may be deposited on the wafers, for example, in dust forms. Many of such dusts are thought to be charged and deposited on the wafers by an electrostatic force. The dusts can be more efficiently removed from the wafers by ionized gas blowing rather than mere clean gas blowing thereto. Therefore, it is more preferable that a so-called ionizer for ionizing a gas or the like be provided in a gas supply nozzle or its vicinities to supply an ionized gas when necessary.

Figure 3:
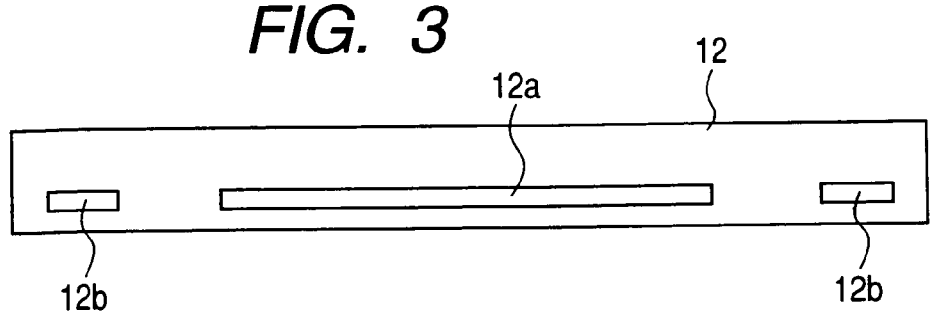
FIG. 3 is a structural view showing a modified example of the gas supply pipe 12 according to the embodiment of the present invention.

In this embodiment, the gas supply pipe provided with a single slit is used for the gas supply. However, the present invention is not limited to such a form. For example, in order to uniformly remove the contaminants or the like from the surface of the wafer, considering the wafer shape, it is necessary for the amount of gas flowing over a central portion of the surface of the wafer to be larger than the amount of gas flowing over both end portions of the surface of the wafer. Therefore, as is seen from FIG. 3 showing the gas supply pipe 12 in the same form as that of FIG. 2A, a large-size slit 12a may be provided in a central portion of the gas supply pipe 12 and small-size slits 12b may be provided in both end portions of the gas supply pipe 12. According to such a structure, it is possible to remove the contaminants or the like from the entire surface of the wafer more efficiently.

Figure 4:
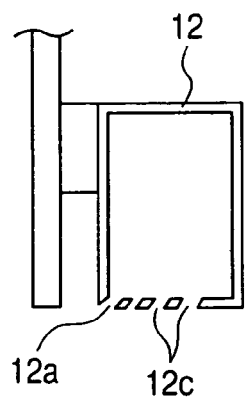
FIG. 4 is a structural view showing a modified example of the gas supply pipe 12 according to the embodiment of the present invention.

As seen from FIG. 4 showing the gas supply pipe 12 in the same form as that of FIG. 2B, slits may be formed in parallel. In this case, assuming that the original slit 12a corresponds to a wafer placed on an upper shelf of the pod 2, a slit 12c corresponding to a wafer placed more below is formed such that a gas can be effectively supplied to the wafer. In such a case, slit shape parameters such as a slit width, a slit formation angle, and a slit length may be changed according to the distance between the slit and the wafer. In this embodiment, the structure in which the slit is provided in the gas supply pipe is used for the actual gas supply. However, the present invention is not limited to this structure. For example, a structure in which a so-called nozzle is located or a plurality of nozzles are arranged may be used. The slit described here can conceptually include a hole in which, for example, a length thereof is equal to a width thereof and a hole having a shape of a so-called pin hole.

Figure 5:
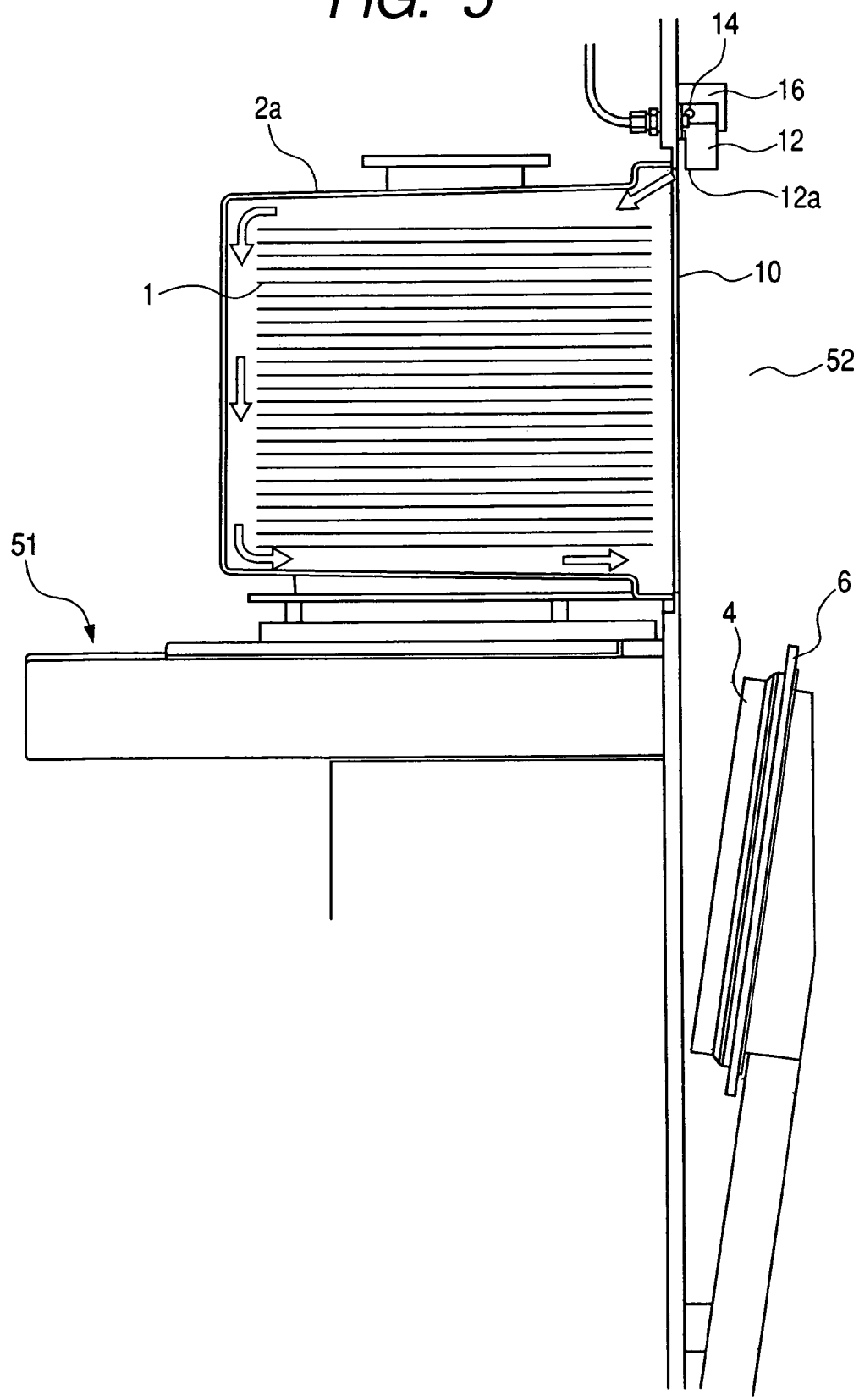
FIG. 5 is a schematic structural view showing a purge apparatus, a pod, a pod lid, and a part of an opener in another embodiment of the present invention when they are cut with a cut plane perpendicular to an opening of the pod.

As shown in FIG. 5, the gas supply pipe 12 may be provided such that it can rotate about a shaft parallel to the direction in which the pipe is extended. The gas supply pipe 12 shown in FIG. 5 is rotatably supported to the inner wall of the transfer chamber 52 through a support shaft 14. The gas supply pipe 12 is connected to a stepping motor 16 and can rotate at predetermined rotation speed. In this embodiment, the gas supply through the gas supply pipe 12 starts upon opening of the lid 4 and the gas supply pipe 12 rotates during the gas supply. Therefore, it is possible to substantially uniformly remove the contaminants or the like from all of the wafers 1 held in the inner portion of the pod 2 by using the clean gas. In this embodiment, the stepping motor is used to rotate the gas supply pipe 12. However, the present invention is not limited to this. Various drive sources including a piezoelectric element can be used and may be associated with the operation of the port door.

Figure 6:
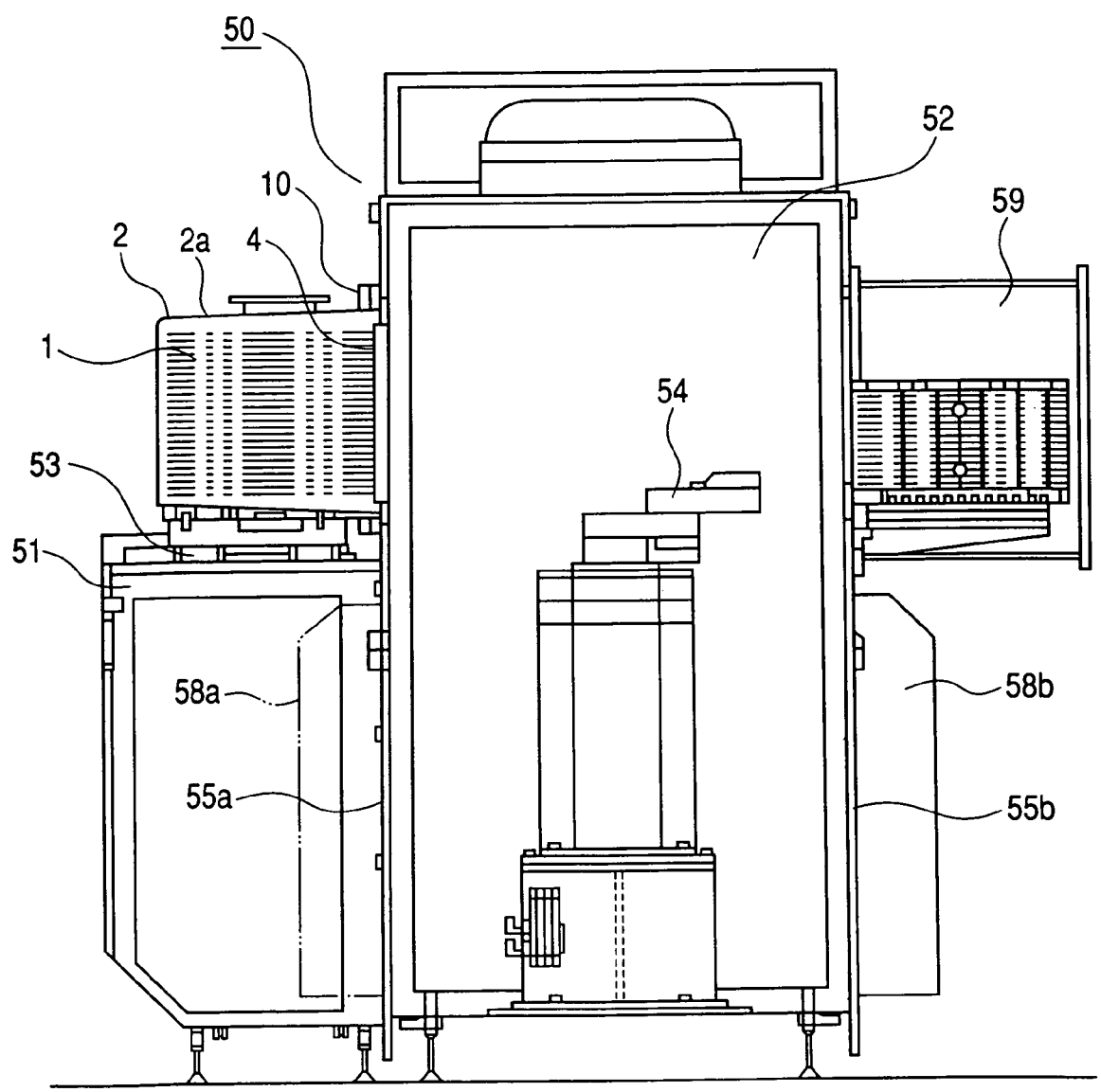
FIG. 6 is an entire side view showing a schematic structure of a general semiconductor wafer processing apparatus to which the present invention is applied.

Next, the case where a purge apparatus according to the present invention is applied to a system including a currently used FOUP will be described below with reference to the drawings. FIG. 6 shows an entire structure of a semiconductor wafer processing apparatus 50 corresponding to a so-called mini-environment system. The semiconductor wafer processing apparatus 50 mainly includes the load port portion (FIMS system) 51, the transfer chamber 52, and a processing chamber 59. The load port portion 51 and the transfer chamber 52 are separated from each other by a load port side partition 55a and a load port side cover 58a which are located at a connection portion therebetween. The transfer chamber 52 and the processing chamber 59 are separated from each other by a processing chamber side partition 55b and a processing chamber side cover 58b which are located at a connection portion therebetween. In order to evacuate dusts from the transfer camber 52 of the semiconductor wafer processing apparatus 50 to maintain high cleanliness, air flow from an upper portion of the transfer chamber 52 to a lower portion thereof is produced by a fan (not shown) provided in an upper portion of the transfer chamber 52. Therefore, the dusts are constantly evacuated downward.

The pod 2 which is a storage container for storing silicon wafers or the like (hereinafter merely referred to "wafers") is mounted on a base 53 located on the load port portion 51. As described earlier, the inner portion of the transfer chamber 52 is maintained to high cleanliness in order to process the wafers 1. Further, the transfer chamber 52 includes a robot arm 54. The wafers are transferred between the pod 2 and the processing chamber 59 by the robot arm 54. The processing chamber 59 normally includes various mechanisms for performing processings, such as thin film formation and thin film processing on the surfaces of the wafers. However, the mechanisms are not directly associated with the present invention, so the description will be omitted.

The pod 2 has a space for storing the wafers 1, each of which is the object to be processed, in the inner portion thereof. The pod 2 includes the box main body 2a having the opening portion provided in one of the surfaces and the lid 4 for enclosing the opening portion. The main body 2a includes the rack having the plurality of shelves for stacking the wafers 1 in one direction. The wafers 1 placed on the shelves are stored in the inner portion of the pod 2 at predetermined intervals. In this example, the direction in which the wafers 1 are stacked is set to the vertical direction. The opening portion 10 of the transfer chamber 52 is provided on the load port portion 51 side. When the pod 2 is to be located on the load port portion 51 such that the pot 2 is close to the opening portion 10, the opening portion 10 is located opposite to the opening portion of the pod 2. The transfer chamber 52 includes an opener 3 (described later) provided on the inner side in the vicinity of the opening portion 10.

Figure 7A:
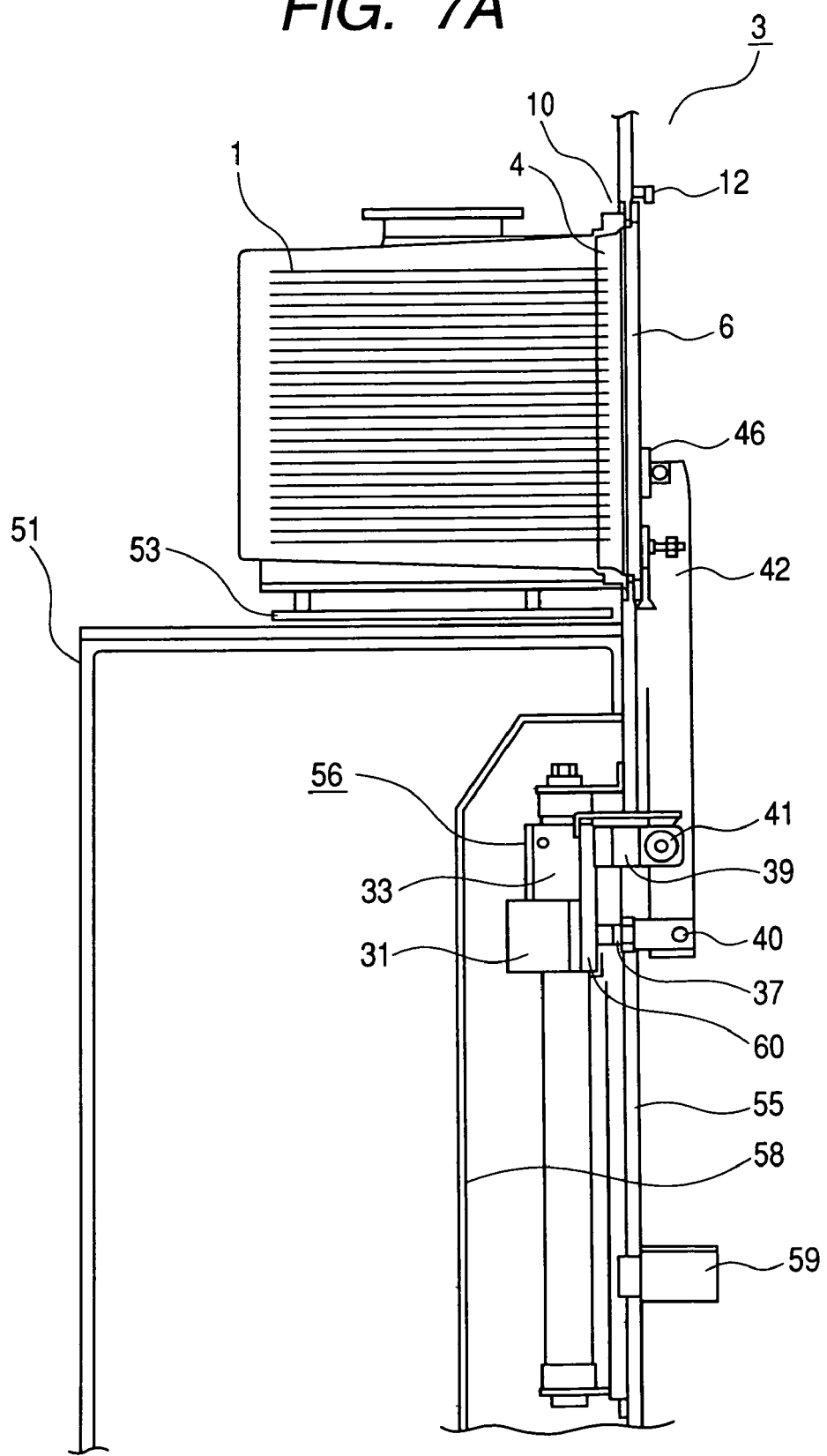
FIG. 7A is a schematic structural enlarged view showing a conventional opener and its vicinities in the apparatus shown in FIG. 6 when they are viewed from side.
Figure 7B:
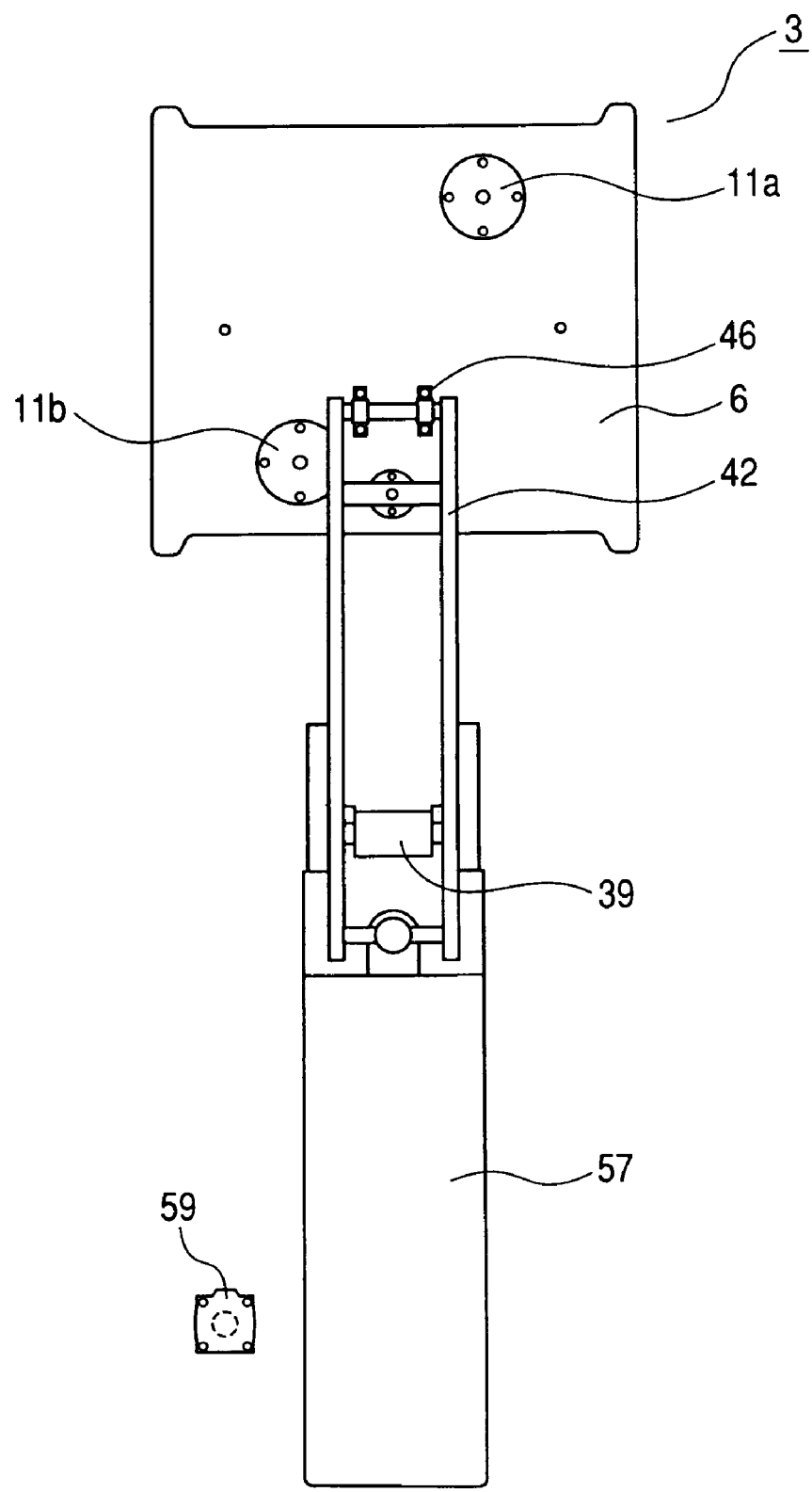
FIG. 7B is a schematic structural view showing the structure shown in FIG. 7A when it is viewed from a transfer chamber side.
Figure 8:
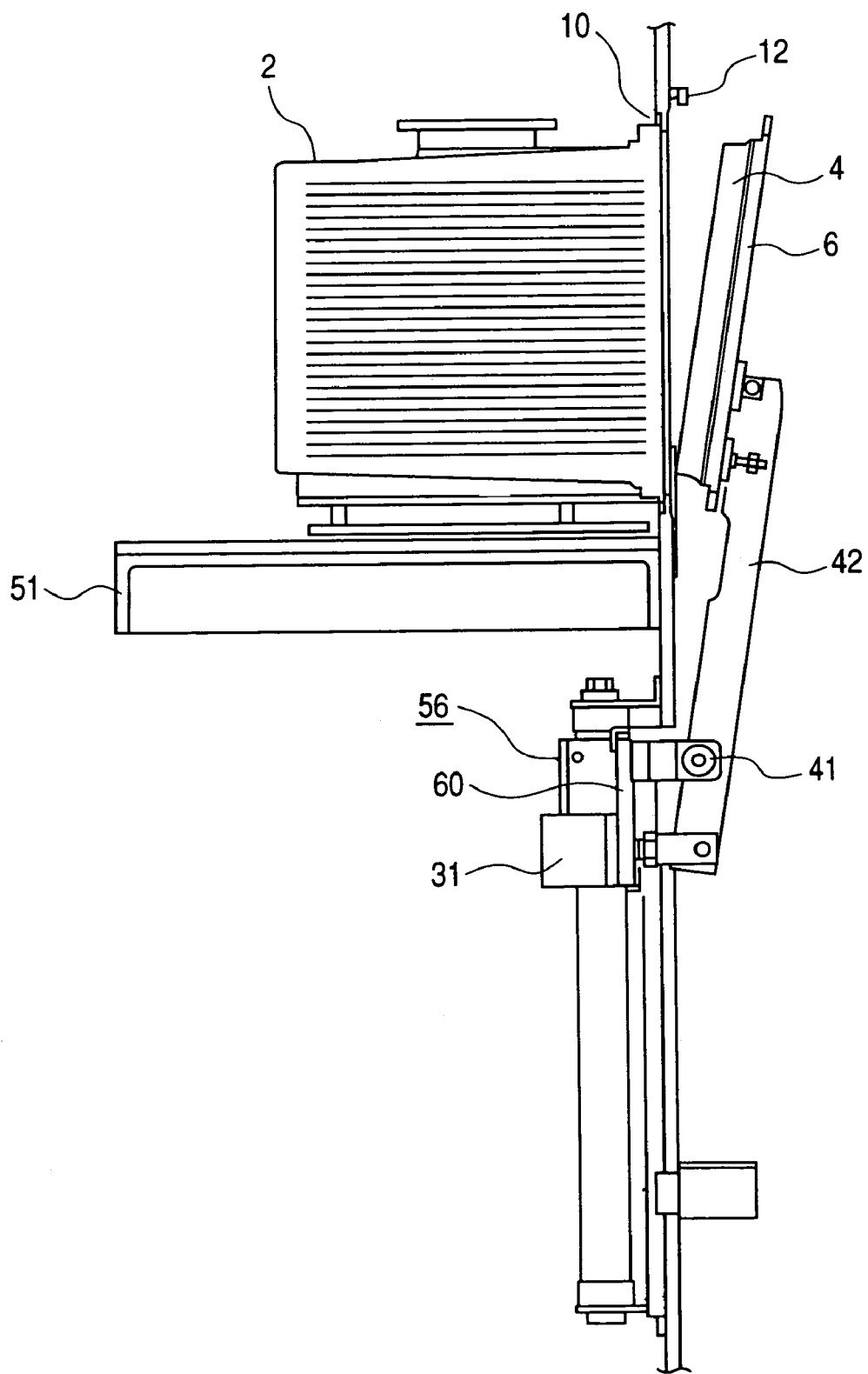
FIG. 8 is a schematic structural view showing the opener and the like to perform purge operation on a wafer when they are viewed from side, which shows a state in which purge preparation is completed.

FIGS. 7A and 7B are an enlarged side cross sectional view showing an opener 3 in a conventional apparatus and a font view showing the opener 3 which is viewed from the transfer chamber 52 side. FIG. 8 is a schematic side cross sectional view showing a state in which the lid 4 is removed from the pod 2 by the opener 3. The opener 3 includes a door 6 and a door arm 42. The door 6 is bonded to a fixed member 46. The door 6 is connected to one end of the door arm 42 through the fixed member 46 to be pivotable about the one end of the door arm 42. The door arm 42 is supported at the other end thereof to a tip end portion of a rod which is a part of air-drive cylinder 31 through a pivot 40 to be pivotable about the pivot 40.

A through hole is provided between the one end of the door arm 42 and the other end of the door arm 42. A pin (not shown) extends through the through hole and a hole of a fixed member 39 fixed to a support member 60 of a movable portion 56 for moving the opener 3 up and down, thereby forming a supporting point 41. Therefore, the door 42 is pivotable about the supporting point 41 according to the extension and retraction of the rod 37 due to the drive of the cylinder 31. The support point 41 of the door arm 42 is fixed to the support member 60 in which the vertically movable portion 56 is provided. The door 6 includes a holding ports 11a and 11b and thus can hold the lid 4 of the pod 2 by vacuum contact.

When the wafers 1 are to be processed using the above-mentioned structure, first, the base 53 on which the pod 2 is mounted is located close to the opening portion 10 of the transfer chamber 52 and the lid 4 is held by the door 6. Then, the rod 37 of the cylinder 31 is retracted, the door arm 42 is pivoted about the support point 41 to increase a distance from the opening portion 10 of the transfer chamber 52. According to the operation, the door 6 is pivoted together with the lid 4 to remove the lid 4 from the pod 2. Such a state is shown in FIG. 8. After that, the movable portion 56 is moved down to transfer the lid 4 to a predetermined waiting position.

The gas supply pipe 12 in the present invention is located above the opening portion 10 of the transfer chamber 52. After the removal of the lid 4 using the door 6, the gas is supplied through the gas supply pipe 12 to remove the contaminants or the like. In order to prevent a significant variation in inner pressure of the transfer chamber 52 or the like due to the supply of the clean gas, it is preferable to simultaneously perform various evacuation operations including the suction and evacuation of the transfer chamber according to the gas supply operation.

In this embodiment, the FOUP and the FIMS system are described as objects. However, application examples of the present invention are not limited to those. The apparatus for removing the contaminants or the like (purge apparatus) according to the present invention can be applied to a system for opening and closing a front-open type container, which stores a plurality of objects to be stored, with a lid of the container to thereby insert and remove the objects to be stored into and from the container.

According to the present invention, the high-clean gas can be suitably and efficiently blown to the surface of the wafer. The spread clean gas can be supplied in the direction in which the wafers are stacked, so that the gas can be substantially blown to each of the wafers. Therefore, with respect to all the wafers held in the pod, it is possible to effectively and surely remove the contaminants such as dusts and impurities which are deposited on the surfaces of the wafers. The purge operation can be performed on the inner portion of the pod using the gas supply nozzle during wafer processing when necessary, with the result that it is possible to hold the wafers in a higher-clean environment. The present invention can be embodied by providing the gas supply pipe and the like in an existing FIMS system. The gas supply pipe and the like can be easily attached to a standardized system in low cost.

As many apparently widely different embodiments of the present invention can be made without departing from the spirit and scope thereof, it is to be understood that the invention is not limited to the specific embodiments thereof except as defined in the claims.

This application claims priority from Japanese Patent Application No. 2004-310327 filed Oct. 26, 2004, which is hereby incorporated by reference herein.

What is claimed is:

1. A lid opening/closing system for removing, from a storage container including a main body and a lid, the lid, the main body including an opening provided in a horizontal direction and a plurality of shelves arranged in a vertical direction, on each of which an object to be stored is placed, the lid being removable from the main body and covering the opening to form an enclosed space with the main body, to open the opening for insertion and removal of the object to be stored, the system comprising:
   a mount base on which the storage container is placed;
   an opening portion located adjacent to the mount base and opposite to the opening in the horizontal direction;
   a door capable of holding the lid and capable of closing the opening portion, the door connecting between the opening and the opening portion by holding the lid and opening the opening portion; and
   a gas supply unit located above the opening portion on a side different from a side on which the mount base is placed in the opening portion, for supplying a predetermined gas to the object to be stored which is stored in the storage container in a state in which the opening and the opening portion are connected to each other,
   wherein the gas supply unit comprises a pipe extending substantially parallel to a purged surface of the object to be stored; and
   the pipe comprises a slit portion arranged to supply the predetermined gas toward the entire surface of the object to be stored in the state in which the opening and the opening portion are connected to each other; wherein the gas supply unit is supported above the opening portion to be pivotable about a shaft substantially parallel to the purged surface of the object to be stored, and the pivot motion of the gas supply unit is in response to an operation of the door.

2. A lid opening/closing system according to claim 1, wherein:
   the slit portion comprises a first slit in the central portion of the pipe and two second slits at the end portions of the pipe, wherein the length of the first slit is greater than the length of either of the second slits,
   whereby the amount of gas passing through the first slit is greater than that passing through the second slits.

3. A lid opening/closing system according to claim 1, wherein:
   the slit portion comprises a plurality of slits arranged in parallel with each other and arranged such that each of the slits supplies the predetermined gas onto the corresponding object.

4. An object-to-be-stored purging method of removing, from a storage container including a main body and a lid, the lid, the main body including an opening provided in a horizontal direction and a plurality of shelves arranged in a vertical direction, on each of which an object to be stored is placed, the lid being removable from the main body and covering the opening to form an enclosed space with the main body, to open the opening, and of performing purge operation by blowing a predetermined gas to the object to be stored which is stored in the storage container, the method comprising:

placing the storage container on a mount base in a lid opening/closing system including an opening portion opposed to the opening and the mount base located in a front surface of the opening portion;

removing the lid from the main body by a door of the lid opening/closing system for closing the opening portion while the lid is held by the door; and performing purging on the object to be stored by blowing the predetermined gas from a gas supply unit located above the opening portion to the object to be stored which is stored in the storage container through the opening and the opening portion, wherein the gas supply unit comprises a pipe extending substantially parallel to a purged surface of the object to be stored; and the pipe comprises a slit portion arranged to supply the predetermined gas toward the entire surface of the object to be stored in the state in which the opening and the opening portion are connected to each other;

wherein the gas supply unit is supported above the opening portion to be pivotable about a shaft substantially parallel to the purged surface of the object to be stored; the predetermined gas is supplied and pivoting by a predetermined angle is performed in the state in which the opening and the opening portion are connected each other, and the pivot motion of the gas supply unit is in response to an operation of the door.

5. A lid opening/closing system according to claim 4, wherein:

the slit portion comprises a first slit in the central portion of the pipe and two second slits at the end portions of the pipe, wherein the length of the first slit is greater than the length of either of the second slits, whereby the amount of gas passing through the first slit is greater than that passing through the second slits.

6. A lid opening/closing system according to claim 4, wherein:

the slit portion comprises a plurality of slits arranged in parallel with each other and arranged such that each of the slits supplies the predetermined gas onto the corresponding object.

* * * * *